United States Patent
Liu et al.

(10) Patent No.: US 10,036,814 B2
(45) Date of Patent: Jul. 31, 2018

(54) X-RAY DETECTOR WITH DIRECTLY APPLIED SCINTILLATOR

(71) Applicant: General Electric Company, Schenectady, NY (US)

(72) Inventors: James Zhengshe Liu, Salt Lake City, UT (US); Habib Vafi, Brookfield, WI (US); Paul Richard Granfors, Santa Clara, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/807,516

(22) Filed: Jul. 23, 2015

(65) Prior Publication Data

US 2017/0023682 A1   Jan. 26, 2017

(51) Int. Cl.
*G01T 1/20* (2006.01)
*G01T 1/24* (2006.01)
*H01L 27/146* (2006.01)

(52) U.S. Cl.
CPC .............. *G01T 1/2018* (2013.01); *G01T 1/24* (2013.01); *H01L 27/1469* (2013.01); *H01L 27/14663* (2013.01)

(58) Field of Classification Search
CPC ... G01T 1/2018; G01T 1/24; H01L 27/14663; H01L 27/1469
See application file for complete search history.

(56) References Cited

U.S. PATENT DOCUMENTS

| 5,198,673 | A | * | 3/1993 | Rougeot | G01T 1/2018 250/370.09 |
|---|---|---|---|---|---|
| 6,146,489 | A | * | 11/2000 | Wirth | H01L 31/02322 118/504 |
| 6,642,524 | B2 | * | 11/2003 | Vafi | G01T 1/2018 250/370.09 |
| 6,867,418 | B2 | * | 3/2005 | Suzuki | G01T 1/20 250/368 |
| 7,301,214 | B2 | * | 11/2007 | Sekine | G01T 1/2018 257/432 |
| 7,388,185 | B2 | * | 6/2008 | Nygard | H01L 27/14634 250/208.1 |
| 8,735,840 | B2 | * | 5/2014 | Berauer | G01T 1/2018 250/370.11 |
| 2011/0297839 | A1 | | 12/2011 | Berauer | |
| 2013/0168796 | A1 | * | 7/2013 | Ikhlef | H01L 27/14636 257/448 |
| 2014/0284486 | A1 | * | 9/2014 | Inoue | G01T 1/202 250/367 |
| 2015/0276941 | A1 | * | 10/2015 | Liu | G01T 1/2018 250/361 R |
| 2016/0070006 | A1 | * | 3/2016 | Konkle | G01T 1/208 250/366 |

* cited by examiner

*Primary Examiner* — Christine S Kim
(74) *Attorney, Agent, or Firm* — Andrus Intellectual Property Law, LLP

(57) ABSTRACT

An x-ray image detector includes a light image sensor having a depth, a front side comprising a sensing surface, and a back side. The x-ray image detector further includes a substrate plate on the back side and surrounding the depth of the light image sensor such that the substrate plate forms a lip around the light image sensor. The lip is level with the front side of the light image sensor. The x-ray image detector further includes a scintillator over the sensing surface of the light image sensor and at least a portion of the lip.

10 Claims, 7 Drawing Sheets

X-RAY DETECTOR WITH DIRECTLY APPLIED SCINTILLATOR

BACKGROUND

This patent relates to x-ray detectors, and more specifically to x-ray detectors fabricated from crystalline silicon such as complementary metal-oxide-semiconductor (CMOS).

In recent years, medical imaging has demonstrated an increasing interest in the use of crystalline silicon-based x-ray detector panels, which are light image sensors having a two-dimensional photodiode array of sensing pixels typically fabricated on crystalline silicon using CMOS technology. Such light image sensors have been demonstrated to outperform the traditional amorphous silicon-based x-ray detector in low dose fluoroscopic products, such as mobile c-arm devices commonly used in surgical settings. In these devices, an object to be imaged is place between an x-ray generator, or x-ray tube, and an image sensor. X-rays are projected at the object, and an x-ray attenuation image containing information about the internal structure of the object is projected onto the x-ray detector. The image represents the x-ray absorption properties of different parts of the object. In the x-ray detector, the x-ray photons are converted to visible light in a scintillator layer. The visible light, in turn, is absorbed into the silicon in the sensing pixels of the light image sensor, where the photons turn into electrons and the electrons are stored in one or more capacitors. The number of electrons in each pixel is proportional to the intensity of light projected onto that pixel. During the readout phase, the number of electrons stored in the capacitor or capacitors associated with each pixel is sampled and then transmitted sequentially to the readout electronics.

SUMMARY

In one embodiment an x-ray imaging detector includes a light image sensor having a depth, a front side comprising a sensing surface, and a back side. The x-ray image detector further includes a substrate plate on the back side and surrounding the depth of the light image sensor such that the substrate plate forms a lip around the light image sensor. The lip is level with the front side of the light image sensor. The x-ray image detector further includes a scintillator over the sensing surface of the light image sensor and at least a portion of the lip.

One embodiment of a method of manufacturing an x-ray image detector includes providing a light image sensor, the light image sensor having a depth, a front side comprising a sensing surface, and a back side. A working plate is also provided with a flat surface area that is larger than the front side of the light image sensor. The front side of the light image sensor is then placed on the flat surface area of the working plate. A substrate plate is then printed on the back side and surrounding the depth of the light image sensor such that the substrate plate forms a lip around the light image sensor that is level with the front side of the light image sensor. The light image sensor and substrate plate are then removed from the working plate and a scintillator is applied over the sensing surface of the light image sensor and extending over at least a portion of the lip.

In another embodiment, a method of manufacturing an x-ray image detector includes providing the light image sensor having a depth, a front side comprising a sensing surface, and a back side. A substrate plate is also provided having a top surface with a surface area larger than the front side of the light image sensor. A cup is then machined into the top surface area of the substrate plate, wherein the cup is sized to accommodate the light image sensor. The light image sensor is then placed in the cup such that the substrate plate forms a lip around the light image sensor that is level with the front side of the light image sensor. A scintillator is then applied over the sensing surface of the light image sensor and at least a portion of the lip.

Various other features, objects and advantages of the invention will be made apparent from the following description taken together with the drawings.

BRIEF DESCRIPTION OF THE DRAWINGS

The drawings illustrate the best mode presently contemplated of carrying out the disclosure. In the drawings.

DETAILED DESCRIPTION

Figure 1:
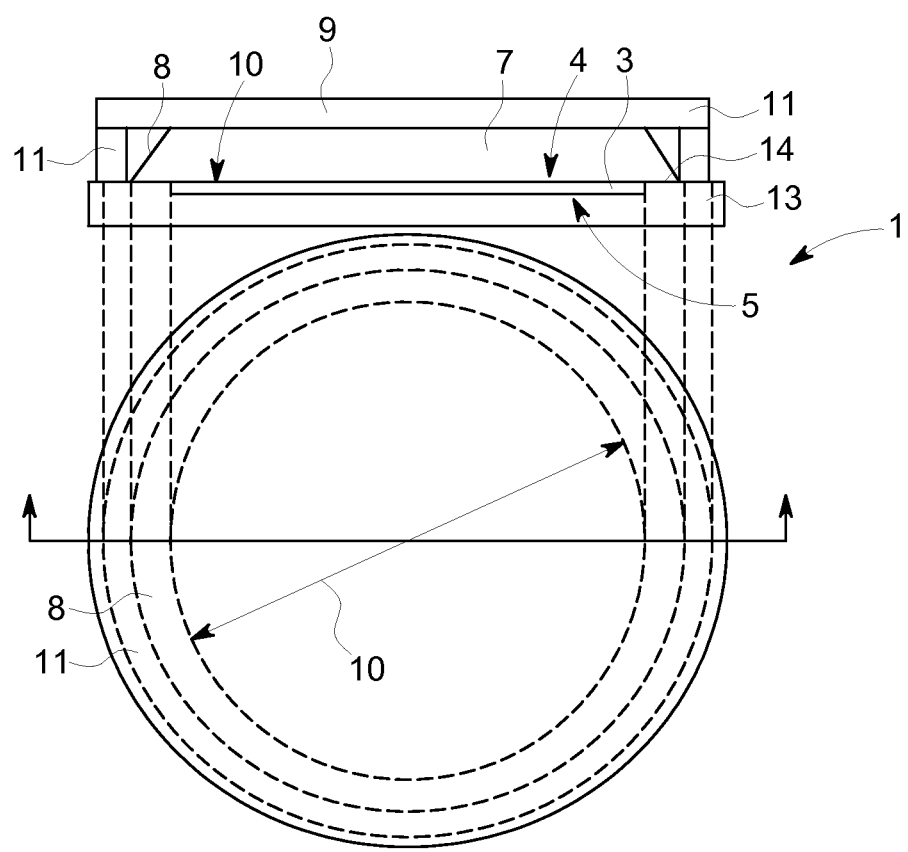
FIG. 1 provides a diagrammatic depiction of an exemplary x-ray image detector according to the present disclosure, including a top view and a cross-sectional view.

Through experimentation and research in the relevant field, the present inventors have recognized that directly depositing, or applying, a scintillator onto a CMOS image panel, or sensor, is advantageous over the use of a scintillator plate with an x-ray scintillator pre-deposited on a fiber optic plate and optically coupled to the light imager. This is because the fiber optic plate is expensive and the coupling between the light imager and the scintillator plate degrades the performance of the detector. However, the inventors recognized that a disadvantage of directly depositing x-ray scintillator onto the light image sensor is that it significantly decreases the usable area of the light image sensor. This is because the scintillator ramping area 8 and the scintillator cover sealing area 11 (FIG. 1) occupy surface space on the light image sensor 3 and make that portion of the light image sensor 3 unusable for imaging.

Presently available x-ray detectors with light image sensors are typically made by piecing several rectangular image sensor tiles together to create a rectangular light image sensor. This is because the field-of-view size requirements of x-ray image detectors usually cannot be met with the available sizes of two-dimensional CMOS wafers. These rectangular image sensor tiles are manufactured by cutting circular silicon wafers into the requisite rectangles. Once the rectangular image sensor tiles are pieced together, a scintillator is then deposited on the arrangement of sensor tiles to create an x-ray image detector.

The present inventors recognized that the manufacturing process of piecing together rectangular image sensor tiles is expensive and wasteful, and that it would be beneficial to develop a way to use the entire surface of a silicon wafer for active sensing pixels, thereby maximizing the available field-of-view per area of silicon and enabling the creation of a light image sensor for an x-ray detector from a single silicon wafer. Accordingly, the present inventors developed the x-ray image detector and method of manufacture disclosed herein which introduces a substrate plate 13 on the back of and around the light image sensor 3 that extends the surface area of the panel to create extra space for the scintillator ramping area and the scintillator cover sealing space so that the number of active CMOS sensing pixels on the silicon is maximized. For example, the light image sensor may be fabricated on any appropriately sized wafer, such as a 150 mm wafer (usually referred to as "6 inch"), a 200 mm wafer (usually referred to as "8 inch"), a 300 mm wafer (usually referred to as "12 inch"), or a 450 mm wafer (usually referred to as "18 inch"). In such an embodiment, the imaging surface 10 is circular and is maximized on the front side 4 of the circular silicon wafer. This reduces the need to piece together several square silicon panels, and thus reduces cost and waste. However, in other embodiments, the light image sensor 3 may be rectangular and the substrate plate 13 may provide a rectangular edge thereof that extends the surface of the sensor in the same fashion.

Figure 2:
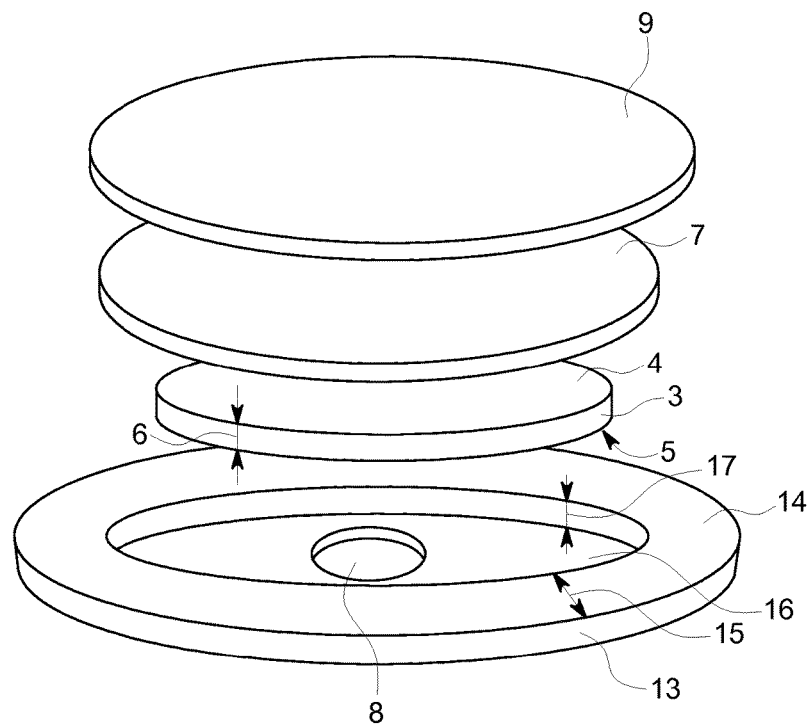
FIG. 2 provides an exploded diagrammatic view of another exemplary x-ray image detector.

FIGS. 1 and 2 depict embodiments of an x-ray image detector 1. The x-ray image detector 1 includes a light image sensor 3 on a substrate plate 13. The light image sensor 3 has a front side 4 with a sensing surface comprising sensing pixels. The sensing surface 10 is maximized on the front side 4 of the light image sensor 3. The light image sensor 3 also has a back side 5 and a depth 6. The substrate plate 13 surrounds the back side 5 and the depth 6 of the light image sensor 3. The substrate plate 13 forms a lip 14 around the light image sensor 3. The lip 14 is level with the front side 4 of the light image sensor 3. Thereby, the lip 14 provides an extension surface around the light image sensor 3 where the non-usable area of the scintillator 7 (including the ramping area 8) and the scintillator cover and moisture sealer 11 can reside. The scintillator 7 is applied directly over the sensing surface 10 on the front side 4 of the image sensor 3. The area of the scintillator 7 over the sensing surface 10 is flat and evenly distributed. At the edges of the scintillator 7, is a ramping surface 8 where the scintillator becomes progressively thinner. The ramping surface 8 of the scintillator 7 is over the lip 14 of the substrate plate 13. As the ramping area 8 of the scintillator 7 is not over any portion of the sensing surface 10 of the light image sensor 3, it does not limit the usable area of the light image sensor.

Depending on the material comprising the scintillator 7, a scintillator cover 9 may need to be applied over the scintillator 7 to protect the scintillator material from moisture and environmental factors that can degrade the material. For example, if the scintillator 7 is a caesium iodine (CsI) material, then a scintillator cover 9 is necessary to protect the CsI material from the degrading effects of moisture. In other embodiments, the scintillator 7 may be a florescent screen, such as gadolinium oxysulphide ($Gd_2O_2S:Tb$), which may not require a scintillator cover 9. In certain embodiments, the scintillator cover may be a carbon fiber material, such as a single piece of carbon approximately 1 mm thick. In other embodiments, the scintillator cover 9 may be a sandwich structure with a thin sheet of carbon fiber material, such as S mm or less, on each side with a filling material therebetween. In one embodiment, the filling material may be a ½ mm of polymethacrylimide material, such as Rohacell®.

In some embodiments, a moisture sealer 11 may be applied around the scintillator 7 (such as around the ramping area 8) to seal the scintillator cover 9 to the lip 14 of the substrate plate 13. The moisture sealer may be, for example, adhesive such as Armstrong 661. In another embodiment, the moisture sealer 11 may be an epoxy encapsulation over the scintillator 7 and/or the scintillator cover 9.

The substrate plate 13 surrounds at least a portion of the back side 5 of the light image sensor 3. The substrate plate 13 also surrounds the depth 6 of the light image sensor 3 such that the top surface of the lip 14 is flush with the front side 4 of the light image sensor 3. Thereby, the light image sensor 3 and substrate plate 13 form a totally flat surface upon which the scintillator can be deposited. The scintillator 7 may be, for example, about 700 μm thick. In such an embodiment, the ramping edge 8 may extend along the lip 14 by about 5 mm, for example. Additionally, the moisture sealer 11 may add an additional 2 to 5 mm around the circumference of the ramping edge 8. The width 15 of the lip 14 preferably extends at least to the edge of the moisture sealer, and preferably beyond. Thus, in one embodiment, the width 15 of the lip 14 of the substrate plate 13 is between 5 and 20 mm. Thus, the lip 14 may extend 10 to 20 mm around the circumference of the light image sensor 3.

As illustrated in FIG. 2, the substrate plate 13 has a cup 16 that accommodates the light image sensor 3. The cup 16 has a depth 17 that is at least as deep as the depth 6 of the light image sensor 3. In certain embodiments where an adhesive or other material is between the light image sensor 3 and the substrate plate 13, the depth 17 of the cup 16 may be larger than the depth 6 of the light image sensor 3. Since the substrate plate 13 forms a supportive surface for the light image sensor 3, the light image sensor 3 can be made very thin. For example, the depth 6 of the silicon wafer of the light image sensor 3 may be 100 μm or less.

The substrate plate 13 may be made of any number of suitable materials. Preferably, the substrate plate 13 is made of a material with a similar thermal expansion coefficient as the silicon wafer of the light image sensor 3. For example, the substrate plate 13 may be comprised of a fine ceramic substrate, such as silicon nitride ($Si_3N_4$). In other embodiments, a polymeric composite may be used such as cyanate esther (CE) or bismaleimide triazine (BT)-based composites with Alumina Nitride (AlN) or Alumina Oxide (Al2O3). In still other embodiments, the substrate plate 13 may be made of machined glass.

Figure 3A:
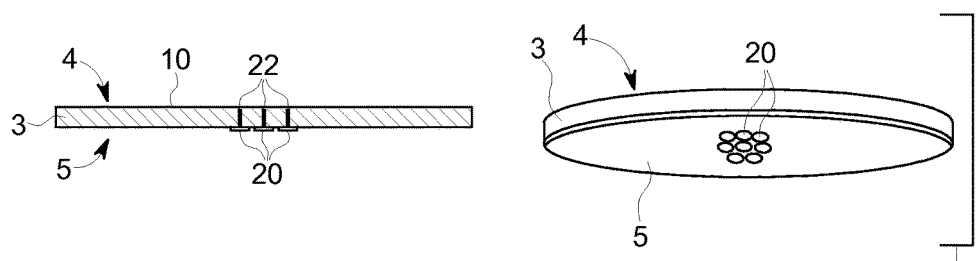
FIGS. 3A and 3B provide a diagrammatic view of exemplary crystalline silicon based light image sensors having contact traces on the back side thereof.
Figure 3B:
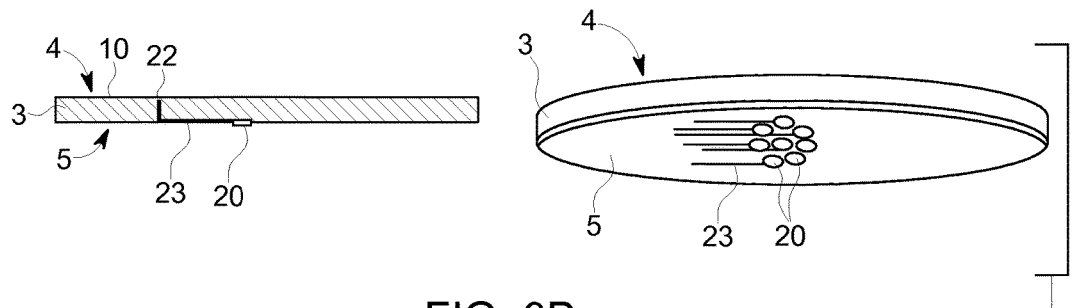

As shown in FIG. 2, the substrate plate 13 may have a hole 8 in the cup 16. The hole is configured to allow access to one or more contact points, or connection points, to allow output from the light image sensor 3. The hole 8 may be any size and configured in any way to allow such access. As shown in FIGS. 3A and 3B, the back side 5 of the light image sensor 3 may have one or more contact traces 20 that provide a conductive connection point to and from the sensing surface 10. In one embodiment, the contact traces 20 may connect to a data bus that runs from the x-ray image detector 1 to a detector controlling board. Digital controlling signals from the detector controlling board to the light image sensor 3, and the digitized image pixel values from the sensing surface 10 to the detector controlling board may be communicated through the contact traces 20 and the data bus. Each contact trace 20 may connect to the sensing surface 10 by a through silicon via (TSV) 22, which is a vertical electrical connection passing through the silicon wafer. The contact trace 20 may be directly below the connected TSV 22, as shown in FIG. 3A. FIG. 3B shows an alternative arrangement where the contact trace 20 may be positioned at any location on the back side 5 with respect to the TSV 22, and may be connected to the TSV 22 by a wire 23 running along the back side 5 of the light image sensor 3. The contact trace 20, wire 23, and TSV 22 may be any conductive material suitable for conducting electrical signals, such as gold.

The substrate plate 13 is preferably formed of a single piece so that it forms an impermeable surface around the back and sides of the light image sensor 3. Preferably, the contact surface between the back side 5 of the silicon wafer of the light image sensor 3 and the cup 16 of the substrate plate 13 is large to prevent exposure of the scintillator 7 to moisture and other environmental factors. Thus, the substrate plate 13 may seal to the back side 5 and/or sides of the light image sensor 3.

The substrate plate 13 may be manufactured in any number of ways capable of producing a flat lip 14 around the circumference, or edge, of the light image sensor 3 with the dimensions and properties described above. In one exemplary method of manufacture, the substrate plate 13 is printed over the back side 5 of the light image sensor 3 by means of a three dimensional metallic and polymer printer (3D printer). In another exemplary method of manufacture, the substrate plate 13 may be machined, such as by routing the cup 16 and hole 8 into a solid plate.

Figure 4:
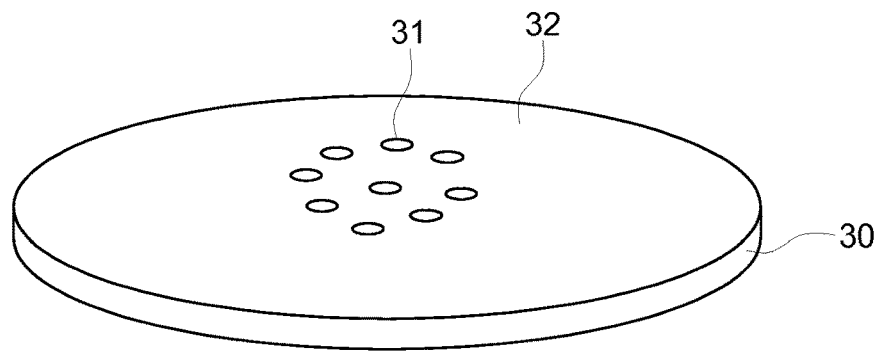
FIG. 4 depicts a step in an exemplary method of manufacturing an x-ray image detector.
Figure 5:
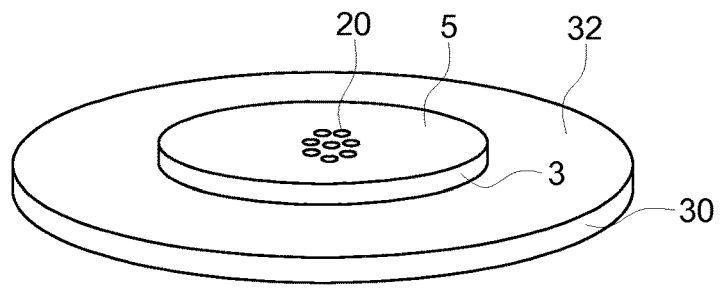
FIG. 5 depicts a subsequent step in the exemplary method of manufactunring an x-ray image detector.
Figure 6:
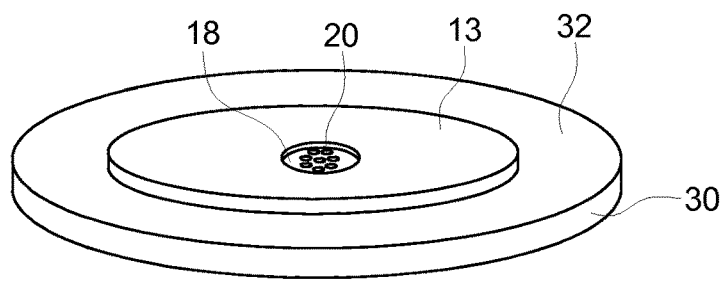
FIG. 6 depicts another subsequent step in the exemplary method of manufacturing an x-ray image detector.

In an exemplary embodiment where the substrate plate 13 is printed onto the light image sensor 3, the process may be performed on a working plate 30. As shown in FIG. 4, a working plate 30 may have holes 31 distributed around an area slightly smaller than the size of the light image sensor 3. The working plate 30 has a flat top surface 32 that enables creation of the flat lip 14 around the light image sensor 3. The working plate 30 may be made of any suitably flat and rigid material, and in one embodiment is made of glass. As shown in FIG. 5, the light image sensor 3 is placed onto the flat top surface 32 of the working plate 30 over the holes 31. A vacuum is created through the holes 31 in order to hold the light image sensor 3 to the plate 30. The substrate plate 13 is then printed onto the back side 5 and surrounding area around the light image sensor 3, as is illustrated in FIG. 6. The substrate plate 13 may be printed with a hole 18 to allow access to the one or more contact traces 20 on the back side 5 of the light image sensor 3, as is described above. In one exemplary embodiment, the 3D printer may print the substrate plate 13 over the back side 5 of the light image sensor 3 in multiple thin layers of fine ceramic substrate, such as $Si_3N_4$.

Figure 7:
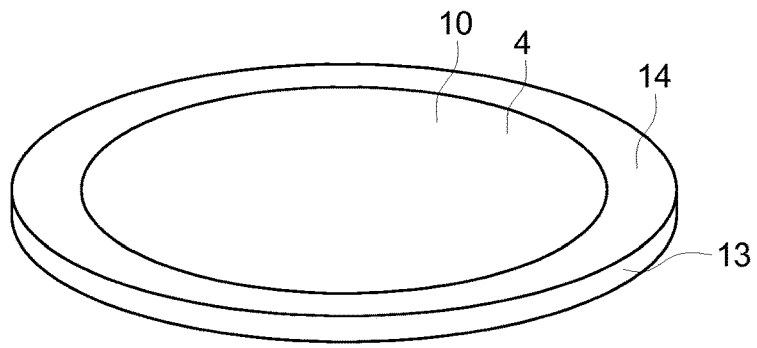
FIG. 7 depicts another subsequent step in the exemplary method of manufacturing an x-ray image detector.
Figure 8:
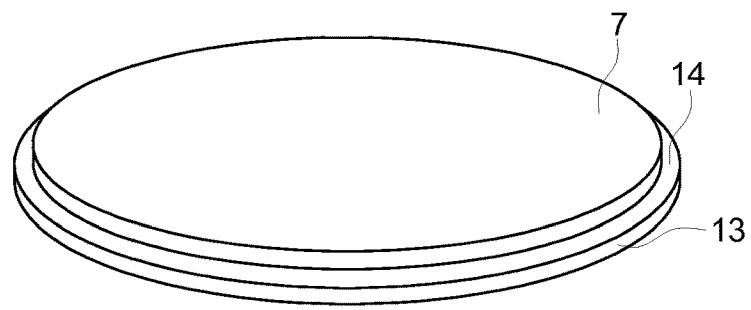
FIG. 8 depicts another subsequent step in the exemplary method of manufacturing an x-ray image detector.
Figure 9:
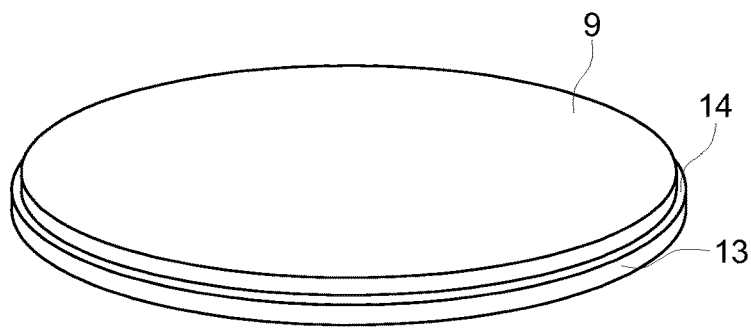
FIG. 9 depicts another subsequent step in the exemplary method of manufacturing an x-ray image detector.

The printed substrate plate 13 and light image sensor 3 may then be removed from the working plate 30. For example, the vacuum may be released and the device separated from the working plate 30. A perspective top view of the combined substrate plate 13 and light image sensor 3 is depicted in FIG. 7. A scintillator may then be deposited over the sensing surface 10 of the light image sensor 3. As is described above, the scintillator 7 also extends onto at least a portion of the lip 14, such that at least the entire ramping edge 8 extends over the lip 14. FIG. 8 depicts the scintillator 7 deposited over the sensing surface 10 of the light image sensor 3 and also covering a portion of the lip 14. Next, in embodiments having a scintillator cover 9, the scintillator cover 9 is applied over the scintillator 7 and extends further onto the lip 14 than the scintillator 7, as is depicted in FIG. 9. The scintillator cover 9 is then sealed to the lip 14, as is described above.

Figure 10:
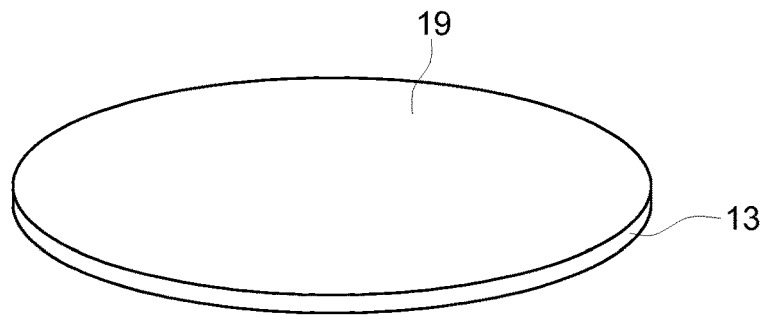
FIG. 10 depicts a step in a second exemplary method of manufacturing an x-ray image detector.

In an embodiment where the substrate plate 13 is manufactured by a machining process, the substrate plate 13 may begin as a solid disc shape with a solid top surface area 19 that is sufficiently larger than the front side 4 of the light image sensor such that a lip 14 can be created around the light image sensor 3. FIG. 10 depicts an exemplary substrate plate 13 prior to the machining process. For example, such a substrate plate 13 may be comprised of a machinable ceramic or a glass material. A cup 16 may then be machined into the top surface area 19. As is described above, the cup 16 is sized to accommodate the light image sensor 3. A hole 8 may also be machined all the way through the bottom side of the substrate plate 13 so that access can be made to contact traces 20 on the back side 5 of the light image sensor 3.

Figure 11:
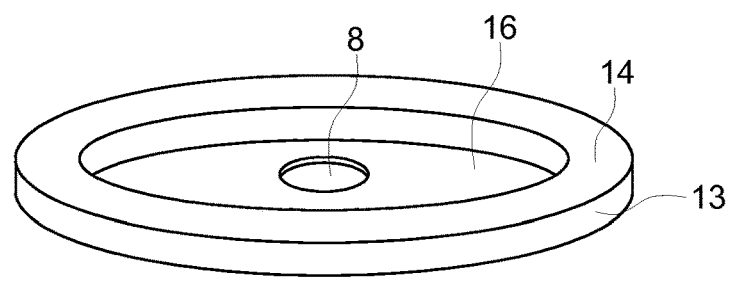
FIG. 11 depicts a subsequent step in the second exemplary method of manufacturing an x-ray image detector.
Figure 12:
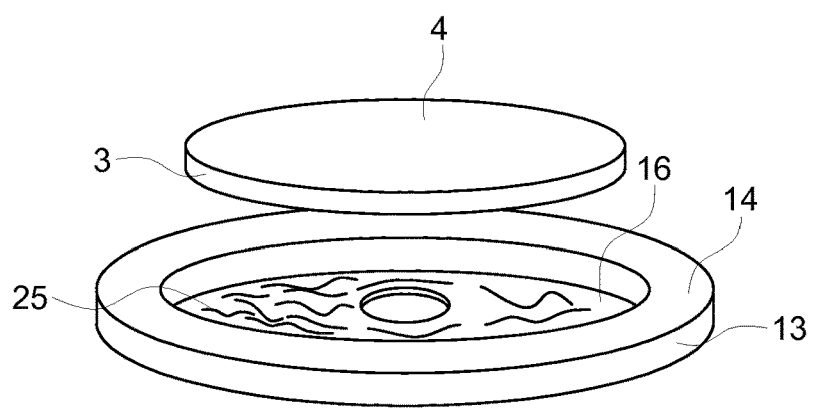
FIG. 12 depicts another subsequent step in the second exemplary method of manufacturing an x-ray image detector.

FIG. 11 shows a machined substrate plate 13. The light image sensor 3 may be placed in the cup 16, and may be connected thereto with an adhesive. For example, as shown in FIG. 12, an adhesive 25 may be applied to the bottom of the cup 16 of the substrate plate 13. Any number of adhesive materials may be appropriate for this application. As an illustrative example, the adhesive 25 may be an epoxy-based adhesive, such as Armstrong A-661 epoxy adhesive. In other embodiments, the adhesive 25 may be applied to the back side 5 of the light image sensor 3 before it is placed into the substrate plate 13. In still other embodiments, the light image sensor 3 may be secured to the cup 16 of the substrate plate 13 by other means. For example, the scintillator cover 9 may be welded or otherwise sufficiently adhered to the lip 14 of the substrate plate 13 in order to hold the light image sensor 3 firmly against the cup 16.

Figure 13:
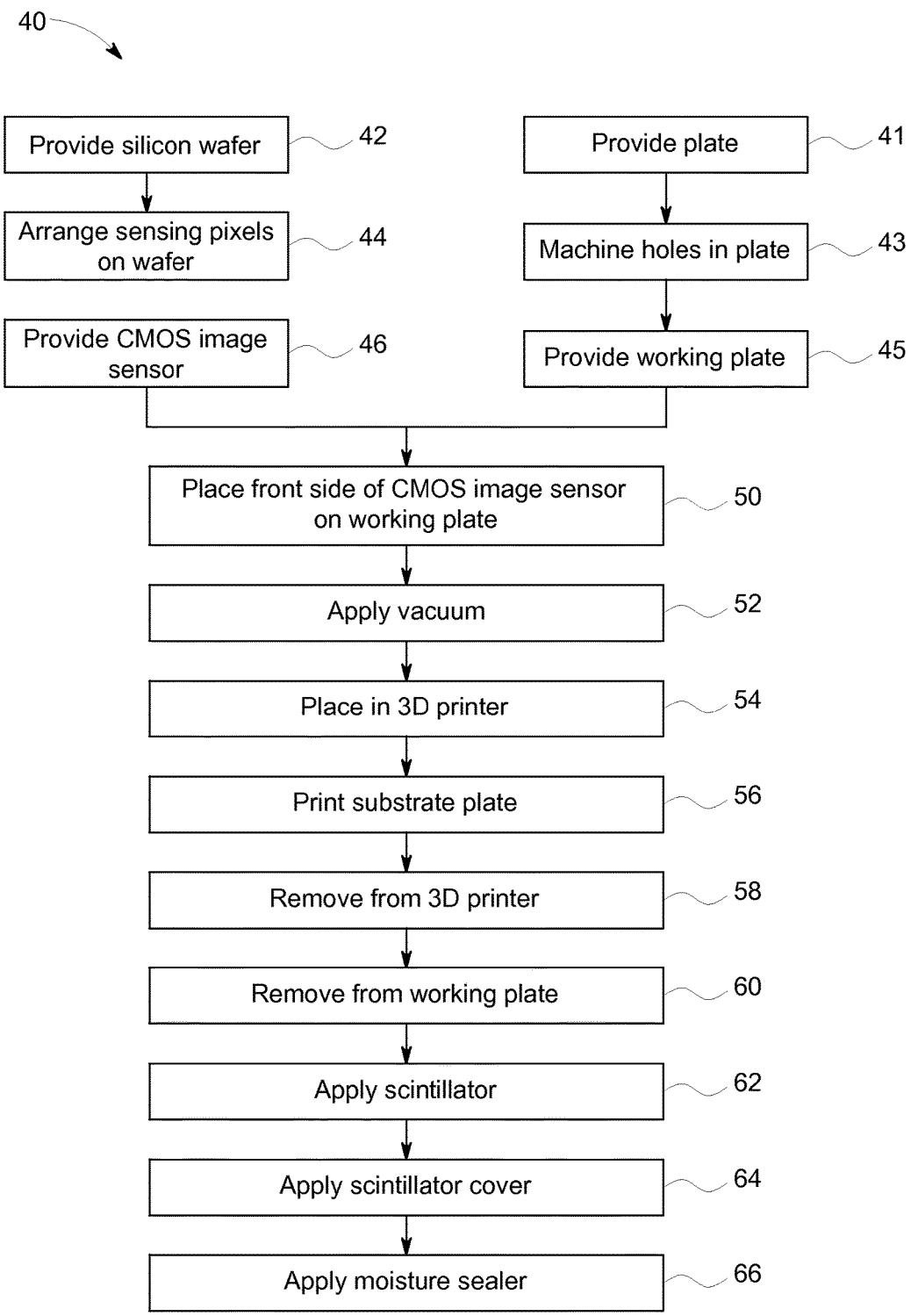
FIG. 13 is a flowchart depicting another exemplary method of manufacturing an x-ray image detector.

FIG. 13 depicts another embodiment of a method 40 of manufacturing an x-ray image detector 1. At step 42, a silicon wafer is provided. Sensing pixels are then arranged on the front side 4 of the wafer at step 44. In a preferred embodiment, the pixels are arranged in a 2-dimensional sensor fabricated using CMOS technology. As described above, the plurality of detector pixels should cover the front side 4 of the substrate plate 13 such that the sensing surface 10 is maximized on the silicon wafer 42. Thereby, the light image sensor 3 is created, and is then provided at step 46 for further manufacture of the x-ray image detector 1.

The working plate 30 is created in another aspect of the method 40 of manufacture that may occur simultaneously, before, or after the manufacture of the light image sensor 3. At step 41, a plate is provided. As described above, the working plate 30 should provide a hard, flat top surface 32, and may be comprised of any material, such as glass, that provides that surface. At step 43, holes are machined in the plate. The working plate is then provided at step 45 for use in the manufacturing process.

At step 50, the light image sensor 3 is placed on the working plate 30. The front side 4 is placed facedown over the holes 31 through the working plate 30. At step 52, a vacuum is applied to secure the light image sensor 3 to the working plate 30. The working plate 30 with the light image sensor 3 secured thereto is then placed in a 3D printer at step 54. At step 56, a substrate plate 13 is printed on the back side 5 and surrounding the depth 6 of the light image sensor 3 such that the substrate plate 13 forms a lip 14 around the light image sensor 3. As is described above, the lip 14 surrounds the front side 4 of the light image sensor 3 and provides a level surface extending therefrom upon which the scintillator 7 can be applied. The working plate 30 is removed from the 3D printer at step 58, and then the substrate plate 13 with the embedded light image sensor 3 is removed therefrom at step 60. At step 62, the scintillator 7 is applied to the device so as to cover the sensing surface 10 of the light image sensor 3 and extending on to the lip 14 of the substrate plate 13. At step 64, a scintillator cover 9 is applied over the scintillator 7. Finally, a moisture sealer is applied at step 66.

Figure 14:
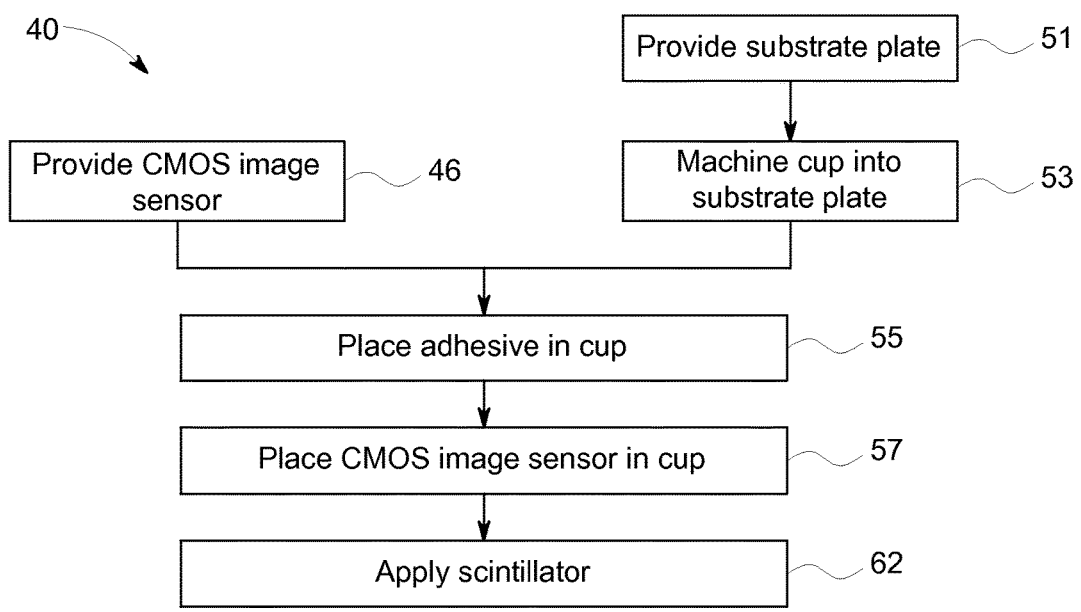
FIG. 14 is a flowchart depicting another exemplary method of manufacturing an x-ray image detector.

In another embodiment, a method 40 of manufacturing an x-ray image detector 1 involves machining the substrate plate 13. FIG. 14 depicts one embodiment of such a method, wherein a light image sensor is provided at step 46 and a plate is provided at step 51 which will become the substrate plate. At step 53, a cup 16 is machined into the substrate plate 13 and is sized to accommodate the light image sensor 3. Adhesive is then placed in the cup at step 55, and the light image sensor 3 is then adhered into the cup at step 57. The scintillator 7 is then applied over the sensing surface 10 of the light image sensor 3 and the lip 14 of the substrate plate 13. As is described above, a scintillator cover 9 and/or a moisture sealer 11 may also be applied over the scintillator 7, depending on the material of the scintillator 7.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. An x-ray imaging detector comprising:
    a light image sensor comprising an uncut silicon wafer with a crystalline structure, the light image sensor having a depth, a front side comprising a sensing surface having multiple sensing pixels, and a back side;
    a substrate plate on the back side and surrounding the depth of the light image sensor such that the substrate plate forms a lip around the light image sensor that is level with the front side of the light image sensor; and
    a scintillator directly deposited onto the multiple sensing pixels of the sensing surface of the light image sensor and at least a portion of the lip.

2. The x-ray imaging detector of claim 1, wherein the sensing surface of the light image sensor is circular.

3. The x-ray imaging detector of claim 2, wherein the diameter of the light image sensor is 150 millimeters, 200 millimeters, or 300 millimeters.

4. The x-ray imaging detector of claim 1, wherein the lip has a width between 5 and 20 millimeters.

5. The x-ray imaging detector of claim 1, wherein the substrate plate is formed as a single piece.

6. The x-ray imaging detector of claim 5, wherein the substrate plate is made of a ceramic.

7. The x-ray imaging detector of claim 6, wherein the substrate plate is printed onto the light image sensor using a 3D printer.

8. The x-ray imaging detector of claim 6, wherein the substrate plate is machined and the light image sensor is coupled to the substrate plate with an adhesive.

9. The x-ray imaging detector of claim 1, further comprising at least one contact trace on the back side of the light image sensor, wherein each contact trace is connected to the sensing surface by a through silicon via (TSV); and
    wherein the substrate plate has a hole to allow access to the at least one contact trace.

10. The x-ray imaging detector of claim 1, further comprising a scintillator cover covering the scintillator.

* * * * *